(12) United States Patent
Hsieh

(10) Patent No.: US 10,624,415 B2
(45) Date of Patent: Apr. 21, 2020

(54) INSOLE WITH HEAT GENERATING SYSTEM

(71) Applicant: Chih-Hua Hsieh, Taipei (TW)

(72) Inventor: Chih-Hua Hsieh, Taipei (TW)

( * ) Notice: Subject to any disclaimer, the term of this patent is extended or adjusted under 35 U.S.C. 154(b) by 0 days.

(21) Appl. No.: 16/221,617

(22) Filed: Dec. 17, 2018

(65) Prior Publication Data
US 2019/0116919 A1  Apr. 25, 2019

Related U.S. Application Data

(63) Continuation-in-part of application No. 15/590,028, filed on May 9, 2017, now abandoned.

(51) Int. Cl.
| | |
|---|---|
| *A43B 7/04* | (2006.01) |
| *H02N 2/18* | (2006.01) |
| *A43B 17/00* | (2006.01) |
| *A43B 3/00* | (2006.01) |
| *H01L 41/113* | (2006.01) |

(52) U.S. Cl.
CPC .............. *A43B 7/04* (2013.01); *A43B 3/0015* (2013.01); *A43B 17/00* (2013.01); *A43B 17/003* (2013.01); *H01L 41/113* (2013.01); *H02N 2/18* (2013.01)

(58) Field of Classification Search
CPC ......... A43B 3/0015; A43B 7/04; A43B 17/00; A43B 17/003; A43B 17/006; H02N 2/18; H02N 11/002
USPC .......................................................... 36/44
See application file for complete search history.

(56) References Cited

U.S. PATENT DOCUMENTS

| | | | | |
|---|---|---|---|---|
| 3,582,691 A | * | 6/1971 | Sonderegger | G01L 1/16 310/328 |
| 3,906,185 A | * | 9/1975 | Gross | A43B 3/0005 219/211 |
| 4,525,644 A | * | 6/1985 | Frohlich | H01L 41/29 200/251 |
| 4,665,301 A | * | 5/1987 | Bondy | A43B 7/025 219/211 |
| 4,823,482 A | * | 4/1989 | Lakic | A41D 19/001 165/46 |
| 4,948,951 A | * | 8/1990 | Balzano | A41D 19/01535 219/211 |
| 5,495,682 A | * | 3/1996 | Chen | A43B 3/0005 36/2.6 |
| 5,500,635 A | * | 3/1996 | Mott | A43B 1/0072 310/311 |
| 5,918,502 A | * | 7/1999 | Bishop | A43B 3/0005 36/136 |

(Continued)

*Primary Examiner* — Anne M Kozak

(57) ABSTRACT

An insole with heat generating system is disclosed, which comprises an insole, a piezoelectric module disposed inside the insole and electrically connected with each other to form an electrical circuit, two flexible conductive strips having a first conductive copper piece and a second conductive copper piece disposed thereon, and at least one resistive heating chip. Wherein the piezoelectric module generates the electrical energy through stepping on the insole, and then turns into the heat energy through the resistive heating chip, thereby generating a temperature for the insole, so the insole with heat generating system can adjust the temperature appropriately, its safety is high, most importantly, the invention does not need to add the battery to generate heat.

4 Claims, 7 Drawing Sheets

(56) References Cited

U.S. PATENT DOCUMENTS

| | | | | |
|---|---|---|---|---|
| 6,127,290 A * | 10/2000 | Koiso | | A43B 7/04 442/72 |
| 7,197,798 B2 * | 4/2007 | Wilkie | | H01L 41/047 29/25.35 |
| 7,219,449 B1 * | 5/2007 | Hoffberg | | A43B 1/0054 36/29 |
| 7,287,965 B2 * | 10/2007 | Vogeley | | F04B 43/046 417/322 |
| 7,312,554 B2 * | 12/2007 | Vogeley | | F04B 43/046 310/316.01 |
| 8,087,186 B2 * | 1/2012 | Rastegar | | H02N 2/18 290/1 A |
| 8,291,612 B2 * | 10/2012 | Ferguson | | A43B 1/0045 219/211 |
| 8,622,753 B2 * | 1/2014 | Balzano | | H01R 13/22 439/225 |
| 8,869,429 B1 * | 10/2014 | Zsolcsak | | A43B 7/04 36/2.6 |
| 9,215,905 B2 * | 12/2015 | Tseng | | A43B 7/02 |
| 2006/0021261 A1 * | 2/2006 | Face | | A43B 3/00 36/132 |
| 2010/0090477 A1 * | 4/2010 | Keating | | A43B 3/0005 290/1 R |
| 2011/0083339 A1 * | 4/2011 | Luo | | A43B 3/0005 36/2.6 |
| 2011/0107771 A1 * | 5/2011 | Crist | | A43B 3/0005 62/3.3 |
| 2013/0020986 A1 * | 1/2013 | Linzon | | H02J 5/00 320/107 |
| 2013/0033042 A1 * | 2/2013 | Fortier | | A43B 3/0015 290/54 |
| 2014/0014403 A1 * | 1/2014 | Miller | | H05K 1/0281 174/260 |
| 2015/0001199 A1 * | 1/2015 | Jeon | | A43B 7/025 219/201 |
| 2015/0282556 A1 * | 10/2015 | Zsolcsak | | A43B 7/34 219/211 |
| 2016/0051006 A1 * | 2/2016 | Dakhil | | A43B 7/02 36/44 |
| 2016/0290878 A1 * | 10/2016 | Severinkangas | | G01L 1/146 |

* cited by examiner

INSOLE WITH HEAT GENERATING SYSTEM

CROSS-REFERENCE TO RELATED APPLICATION

This patent application is a continuation-in-part of U.S. patent application Ser. No. 15/590,028, filed May 9, 2017, which is a continuation-in-part of U.S. patent application Ser. No. 14/583,123, filed on Dec. 25, 2014, the contents of which are hereby incorporated by reference in its entirety.

BACKGROUND OF THE INVENTION

(1) Field of the Invention

The present invention relates to an insole with heat generating system, particularly to the insole that does not require a battery to enhance the insole temperature and keep the foot warm.

(2) Description of the Related Art

In the prior art, most of the heating insoles are mainly made of materials that do not easily to conduct heat, such as leather, polymer, etc., to reduce the heat loss and achieve the effect of warmth.

However, the basic requirement for the aforementioned effect is that the wearer need to have enough feet temperature, therefore the heat insulation effect is often limited if the wearer's feet temperature is too low.

According to the prior art, there are also heating insoles generated by battery power or electric power, but the insoles temperature control is poor and is easy to have overheating problems, endangering the safety of wearer. Moreover, the heating insoles often have poor cushion effects and reduce the user's comfort and convenience, since there are batteries disposed therein.

In view of this, the main purpose of the present invention is to solve the aforementioned problems.

SUMMARY OF INVENTION

The objective of the present invention is to provide an insole with heat generating system, thereby keeping wearer's feet warm easily in cold weather and providing the wearer with a comfortable walking experience.

The technical scheme of the present invention is to provide an insole with heat generating system comprising: an insole, a piezoelectric module disposed inside the insole and electrically connected with each other to form an electrical circuit, two flexible conductive strips having a first conductive copper piece and a second conductive copper piece disposed thereon, and at least one resistive heating chip; the piezoelectric module which is subjected to pressure and generate electrical energy, disposed in a heel cup of the insole, sequentially comprising a first conductive layer, a first compound crystal layer, a second conductive layer, and a second compound crystal layer, wherein the first conductive layer and the second conductive layer include an insulating layer disposed therebetween and surrounding the first compound crystal layer; the first conductive layer is electrically connected with second conductive copper piece, and the second compound crystal layer is electrically connected with the first conductive copper piece; wherein the resistive heating chip is a surface mount device (SMD), electrically connected between free ends of the two flexible conductive strips and bridged together by means of a surface mount technology (SMT), and disposed at a forefoot of the insole; wherein the insole includes an upper layer, a lower layer corresponding to the upper layer and disposed at a bottom side thereof, and an adhesive layer disposed between the upper layer and the lower layer, the adhesive layer configured to connect with the upper layer and the lower layer to fix the piezoelectric module, the flexible conductive strips and the resistive heating chip, wherein the upper layer is a high density ethylene vinyl acetate (EVA) plastic layer having a heat-conducting function, and the lower layer is a low density EVA plastic layer to which a blowing agent is added to form heat insulation, whereby the upper layer can produce a heat storage effect; wherein the first and second conductive copper piece are parallel to each other and lower surfaces of which are adhered to a thin film to be positioned and not easily broken; the thin film has a bottom surface adhered to a top surface of the lower layer of the insole and has a top surface adhered to a lower surface of the top layer of the insole.

More preferably, wherein both the first conductive layer and the second conductive layer are made of copper conductive bodies, and both the first compound crystal layer and the second compound crystal layer are sintered by mixing sodium tartrate, quartz, and ceramic.

More preferably, wherein the upper layer body corresponding to the second compound crystal layer includes a first insulating sticker; the adhesive layer corresponding to the first conductive layer includes a second insulating sticker.

More preferably, wherein the upper layer contains carbon powder or stone powder added therein to enhance the thermal conductivity.

More preferably, wherein the upper layer body (11) corresponded to the second composite sintered body (24) includes a first insulated sticker (5), said first insulated sticker (5) corresponded to the first conductive layer (21) including a second insulated sticker (6).

Compared to the prior art, the present invention has the following advantages:

Through the piezoelectric module, the flexible conductive strips, and the resistive heating chip, the temperature control of the insole is not too high or low, thereby achieving high safety, battery-free and good impact resistance.

Besides, the piezoelectric module generates the electrical energy through stepping on the insole, and then turns into the heat energy through the resistive heating chip, thereby generating a temperature for the insole. Compared to the prior art, the insole with heat generating system can adjust the temperature appropriately, its safety is high, most importantly, the invention does not need to add the battery to generate heat.

DETAILED DESCRIPTION OF THE INVENTION

Figure 1:
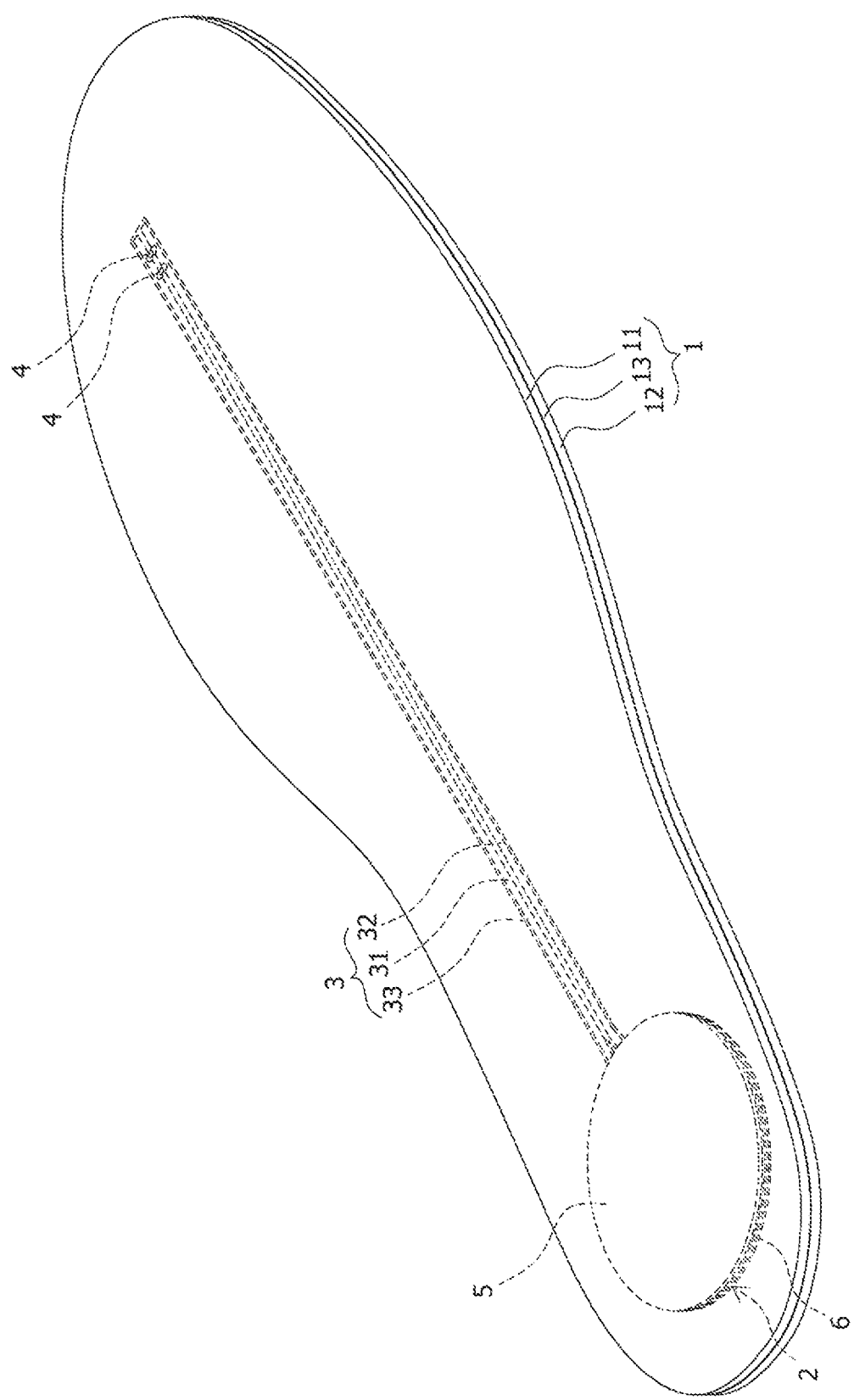
FIG. 1 is a perspective schematic view of an insole with heat generating system of the present invention.
Figure 2:
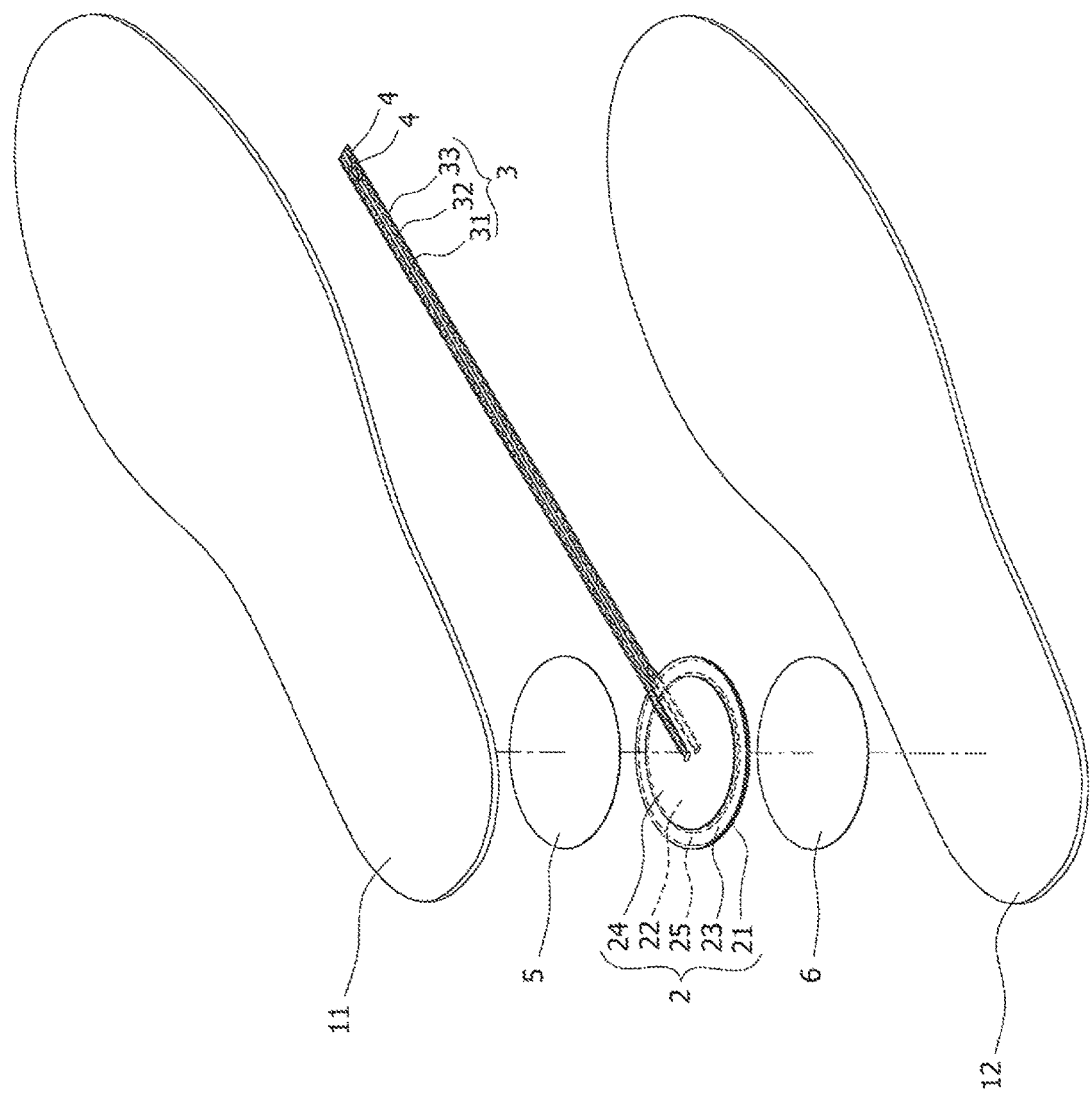
FIG. 2 is an exploded view of the present invention.
Figure 3:
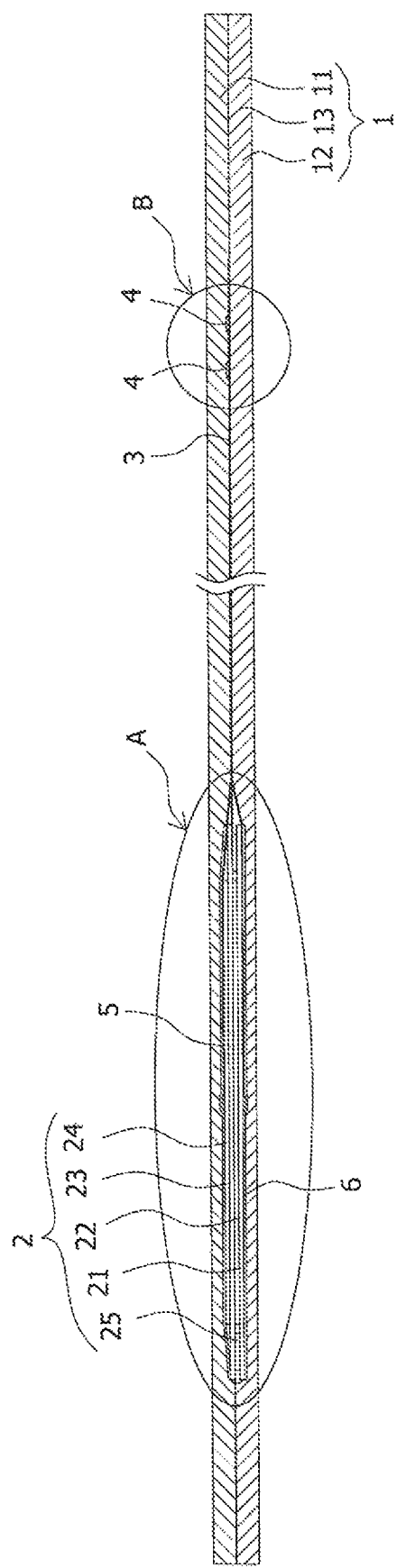
FIG. 3 is a cross-sectional view of the present invention.
Figure 4:
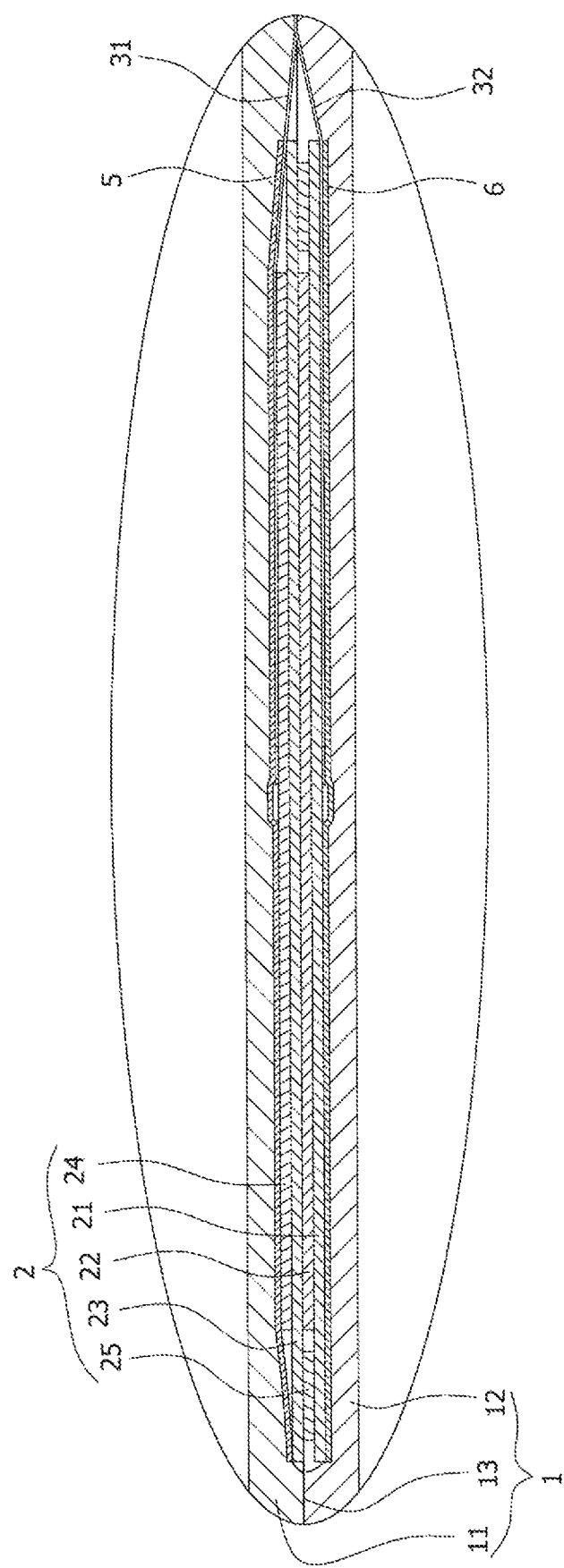
FIG. 4 is an enlarged partial view of a part A in FIG. 3.
Figure 5:
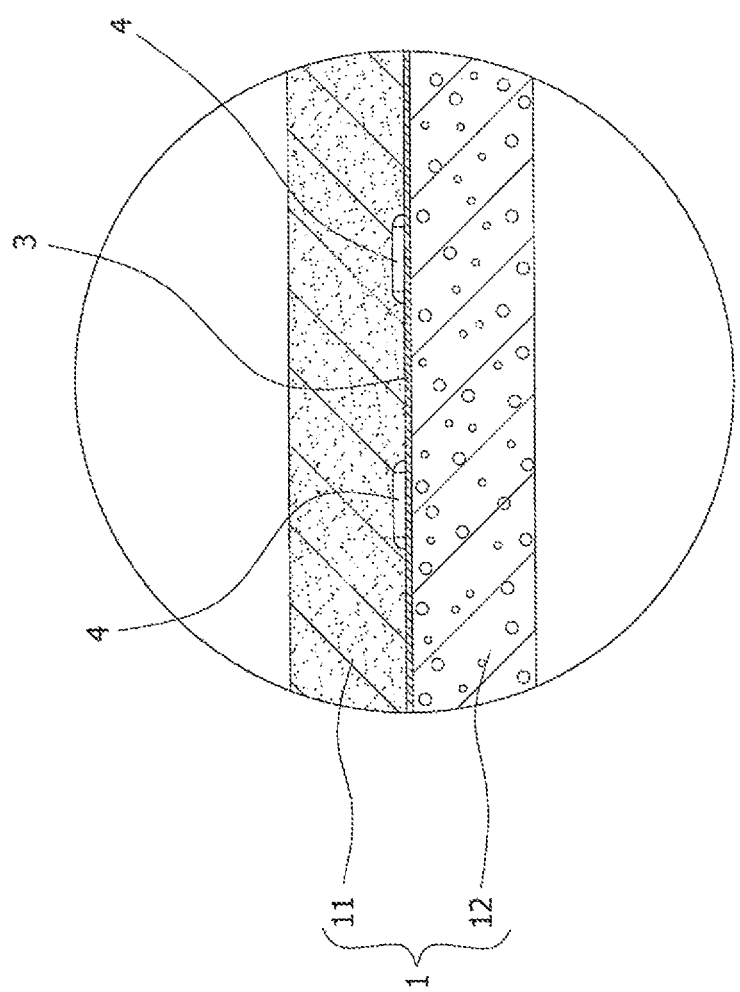
FIG. 5 is an enlarged partial view of a part B in FIG. 3.
Figure 6:
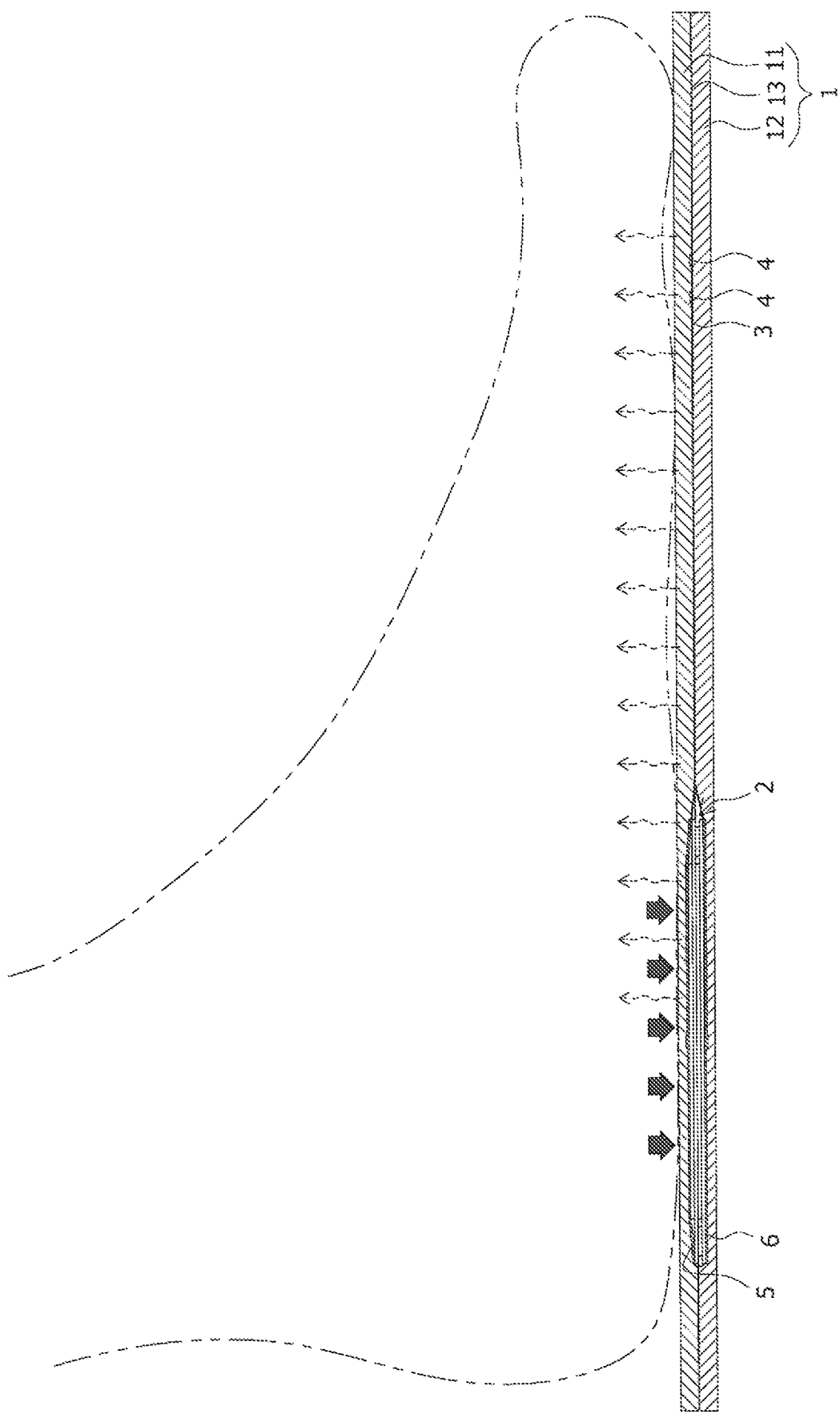
FIG. 6 is a cross-sectional view shown a foot stepping on the insole of the present invention.
Figure 7:
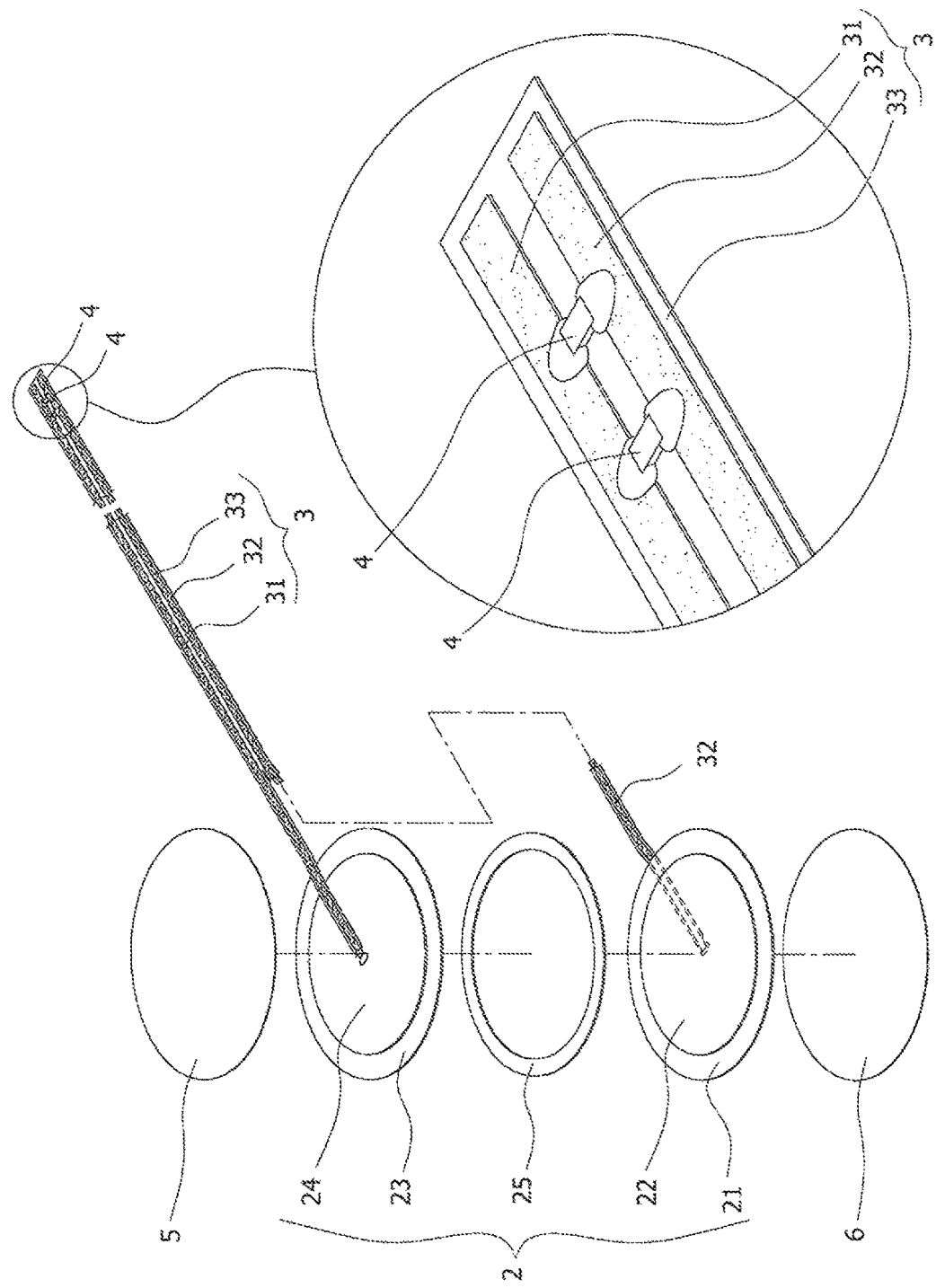
FIG. 7 is an exploded view of a piezoelectric module and two flexible conductive strips of the present invention.

Referring to FIGS. 1-5, the figures disclose an insole with heat generating system comprising: an insole (1), a piezoelectric module (2) disposed inside the insole (1) and electrically connected with each other to form an electrical circuit, two flexible conductive strips (3) having a first conductive copper piece (31) and a second conductive copper piece (32) disposed thereon, and at least one resistive heating chip (4);

the piezoelectric module (2) which is subjected to pressure and generate electrical energy, disposed in a heel cup of the insole (1), sequentially comprising a first conductive layer (21), a first compound crystal layer (22), a second conductive layer (23), and a second compound crystal layer (24), wherein the first conductive layer (21) and the second conductive layer (23) include an insulating layer (25) disposed therebetween and surrounding the first compound crystal layer (22); the first conductive layer (21) is electrically connected with second conductive copper piece (32), and the second compound crystal layer (24) is electrically connected with the first conductive copper piece (31);

wherein the resistive heating chip (4) is a surface mount device (SMD), electrically connected between free ends of the two flexible conductive strips (3) and bridged together by means of a surface mount technology (SMT), and disposed at a forefoot of the insole (1);

The resistive heating chip (4), which is an electronic component that converts electric current to heat. The heating element inside the electronic component is an electrical resistor, and works on the principle of Joule heating: an electric current passing through a resistor will convert that electrical energy into energy. When the early electronic components first came out, they only had the through-hole technology (THT). Therefore, the electronic components must be additionally designed with a solder fillet to pass through the circuit board to achieve the purpose of soldering the components on the circuit board. However, the SMT is a method for producing electronic circuits in which the components are mounted or placed directly onto the surface of printed circuit boards. The SMT relies on "solder paste". The solder paste is a gelatinous mixture of powdered conductive metal and flux, which is a liquid or semi-liquid chemical compound that acts as a binding, cleaning, and wetting agent. As long as the solder paste is printed on the solder pad that need to be soldered, then the electronic component or the surface mount device (SMD) is placed on top, and then the solder paste is melted through a high-temperature reflow oven. At this point, the solder paste melted into a liquid will coat the SMD, and after the temperature is cooled back to the solid, the SMD is soldered to the board. Because SMD is not limited by the soldering fillet, it can be made into a smaller and thinner product, or other miniature electronic devices, the heating device of the insole is made using this technical feature.

wherein the insole (1) includes an upper layer (11), a lower layer (12) corresponding to the upper layer (11) and disposed at a bottom side thereof, and an adhesive layer (13) disposed between the upper layer (11) and the lower layer (12), the adhesive layer (13) configured to connect with the upper layer (11) and the lower layer (12) to fix the piezoelectric module (2), the flexible conductive strips (3) and the resistive heating chip (4), wherein the upper layer (11) is a high density ethylene vinyl acetate (EVA) plastic layer having a heat-conducting function, and the lower layer (12) is a low density EVA plastic layer to which a blowing agent is added to form heat insulation, whereby the heat generated by the resistive heating chip (4) will be conducted and stored in the upper layer (11);

wherein the first and second conductive copper piece (31, 32) are parallel to each other and lower surfaces of which are adhered to a thin film (33) to be positioned on the lower layer (12) and not easily broken; the thin film is configured to hold the flexible conductive strips (3) and has a thermal insulation effect.

In the above, the piezoelectric module (2) and the resistive heating chips (4) can control the temperature, so there is no problem that the temperature is too high or too low, the safety is high and no additional power supply is required; the resistive heating chips (4) are directly bridged between the first conductive copper piece (31) and the second conductive copper piece (32) means of the SMT or a flux. As the SMT does not need to perforate holes on the flexible conductive strips (3), the resistive heating chips (4) can be directly welded to the flexible conductive strips (3) without the need for solder joints, so the heat conduction of the heat generating system of the present invention is fast, the volume is thin and will not make the insole surface protrusion, and can quickly achieve warming and heating effect.

Besides, the piezoelectric module (2) is composed by the first conductive layer (21), first compound crystal layer (22), second conductive layer (23), and second compound crystal layer (24), the components are simple, not only can reduce the manufacturing cost, but also reduce the probability of occurrence of the failure.

Moreover, the piezoelectric module (2) generates the electrical energy through stepping on the insole, and then turns into the heat energy through the resistive heating chip (4), thereby generating a temperature for the insole. Compared to the prior art, the insole with heat generating system can adjust the temperature appropriately, its safety is high, most importantly, the invention does not need to add the battery to generate heat.

On the other side, the insole (1) can maintain the original thickness and cushion effect thereof to ensure the wearer safety and fitness.

Wherein both the first conductive layer (21) and the second conductive layer (23) are made of copper conductive bodies, and both the first compound crystal layer (22) and the second compound crystal layer (24) are sintered by mixing sodium tartrate, quartz, and ceramic.

wherein the upper layer (11) corresponding to the second compound crystal layer (24) includes a first insulating sticker (5); the adhesive layer (13) corresponding to the first conductive layer (21) includes a second insulating sticker (6).

Wherein the upper layer (11) contains carbon powder or stone powder added therein to enhance the thermal conductivity.

The flexible conductive strips (3) are attached to the thin film (33), and the thin film (33) attached on the upper surface of the lower layer (12). Then, the upper layer (11) and the lower layer (12) are tightly bounded together by the adhesive layer (13).

The first and second insulating sticker (5, 6) can pretend short-circuiting or damage of contact between the upper layer (11) and the flexible conductive strips (3), and the first conductive layer (21) and the.

The upper layer (11) can avoid having a short circuit or causing damage with the flexible conductive strips (3) by applying the first insulating sticker (5) and the second insulating sticker (6); the same approach can also be used between the upper layer (11) and the first conductive copper piece (31), and the first conductive layer (21) and the second conductive copper piece (32).

The above description of the detailed embodiments is only to illustrate the preferred implementation according to the present invention, and it is not to limit the scope of the present invention. Accordingly, all modifications and variations completed by those with ordinary skill in the art should fall within the scope of the present invention defined by the appended claims.

I claim:

1. An insole with heat generating system comprising:
the insole (1), a piezoelectric module (2) disposed inside the insole (1) and electrically connected with the insole (1) to form an electrical circuit, two flexible conductive strips (3) having a first conductive copper piece (31) and a second conductive copper piece (32) disposed thereon, and at least one resistive heating chip (4) configured to convert electrical energy into heat energy;
wherein the piezoelectric module (2) is configured to generate electrical energy by pressure during use, disposed in a heel cup of the insole (1), sequentially comprising a first conductive layer (21), a first compound crystal layer (22), a second conductive layer (23), and a second compound crystal layer (24), wherein the first conductive layer (21) and the second conductive layer (23) include an insulating layer (25) disposed therebetween and surrounding the first compound crystal layer (22); the first conductive layer (21) is electrically connected with the second conductive copper piece (32), and the second compound crystal layer (24) is electrically connected with the first conductive copper piece (31);
wherein the at least one resistive heating chip (4) is electrically connected between free ends of the two flexible conductive strips (3) and disposed at a forefoot of the insole (1);
wherein the insole (1) includes an upper layer (11), a lower layer (12) corresponding to the upper layer (11) and disposed at a bottom side thereof, and an adhesive layer (13) disposed between the upper layer (11) and the lower layer (12), the adhesive layer (13) configured to connect the upper layer (11) and the lower layer (12) to fix the piezoelectric module (2), the flexible conductive strips (3) and the at least one resistive heating chip (4), wherein the upper layer (11) is a high density ethylene vinyl acetate (EVA) plastic layer having a heat-conducting function, and the lower layer (12) is a low density EVA plastic layer to which a blowing agent is added to form heat insulation, whereby the heat generated by the at least one resistive heating chip (4) is conducted and stored in the upper layer (11);
wherein the first and second conductive copper pieces (31, 32) are parallel to each other and have lower surfaces thereof being adhered to a thin film (33) for positioning without breaking the flexible conductive strips (3); the thin film is configured to hold the flexible conductive strips (3) and has a thermal insulation effect.

2. The insole with heat generating system according to claim 1, wherein both the first conductive layer (21) and the second conductive layer (23) are made of copper conductive bodies, and both the first compound crystal layer (22) and the second compound crystal layer (24) are sintered by mixing sodium tartrate, quartz, and ceramic.

3. The insole with heat generating system according to claim 1, wherein the upper layer body is connected to the second compound crystal layer (24) by a first insulating sticker (5); the adhesive layer (13) is connected to the first conductive layer (21) by a second insulating sticker (6).

4. The insole with heat generating system according to claim 1, wherein the upper layer (11) contains carbon powder or stone powder added therein to enhance the thermal conductivity.

* * * * *